310-335 SR
10/22/85 XR 4,549,107

United States Patent [19]

Kaneko et al.

[11] Patent Number: 4,549,107

[45] Date of Patent: Oct. 22, 1985

[54] ULTRASONIC BEAM FOCUSING DEVICE WITH A CONCAVE SURFACE

[75] Inventors: Nagao Kaneko, Yokohama; Yoshinori Fujimori, Kawasaki; Seizaburo Shimizu, Yokohama; Shin Obara, Tokyo, all of Japan

[73] Assignee: Tokyo Shibaura Denki Kabushiki Kaisha, Kawasaki, Japan

[21] Appl. No.: 698,757

[22] Filed: Feb. 7, 1985

Related U.S. Application Data

[63] Continuation of Ser. No. 523,599, Aug. 16, 1983, abandoned.

[30] Foreign Application Priority Data

Sep. 28, 1982 [JP] Japan ............................... 57-168868

[51] Int. Cl.[4] .............................................. H01L 41/08

[52] U.S. Cl. .................................... 310/327; 310/800; 310/335

[58] Field of Search ................ 310/326, 327, 334-337, 310/800; 367/150, 152, 162; 179/110 A

[56] References Cited

U.S. PATENT DOCUMENTS 3,950,660 4/1976 McElroy ......................... 310/336 X
3,969,927 7/1976 Yoshida et al. ................. 310/326 X
3,995,179 11/1976 Flournoy et al. ................... 310/335
4,296,349 10/1981 Nakanishi et al. .................. 310/335
4,297,607 10/1981 Lynnworth et al. ........... 310/335 X
4,383,194 5/1983 Ohigashi et al. .................... 310/326

FOREIGN PATENT DOCUMENTS 0015886 9/1980 European Pat. Off. ........ 179/110 A
0037877 10/1981 European Pat. Off. ........ 179/110 A
53-25389 3/1978 Japan .
55-163999 12/1980 Japan .

OTHER PUBLICATIONS

Miniature Piezoelectric Polymer Ultrasonic Hydrophone Probes, by P. A. Lewin, *Ultrasonics,* Sep. 1981, pp. 213-215.

*Primary Examiner*—Mark O. Budd
*Attorney, Agent, or Firm*—Oblon, Fisher, Spivak, McClelland & Maier

[57] ABSTRACT

An ultrasonic beam focusing device with a concave surface comprises a cylindrical housing, a circular piezoelectric polymer film curved to have a concave shape relative to an acoustically active surface thereof and having a pair of circular electrodes at two surfaces thereof, for generating an ultrasonic beam focused at a point and for transducing the received ultrasonic beam into electric signals, leads respectively connected to the electrodes, a rigid polyurethane layer formed in tight contact with an electrode inside the housing at the side of an acoustically inactive surface of the piezoelectric polymer film, for absorbing an ultrasonic beam at the side of the acoustically inactive surface and for supporting the piezoelectric polymer film, and an insulating layer formed in contact with an electrode for electrically insulating the electrode.

8 Claims, 9 Drawing Figures

ULTRASONIC BEAM FOCUSING DEVICE WITH A CONCAVE SURFACE

This application is a continuation of application Ser. No. 523,599, filed Aug. 16, 1983 now abandoned.

BACKGROUND OF THE INVENTION

The present invention relates to a λ/2 wavelength mode ultrasonic beam focusing device with a concaved piezoelectric polymer film, and to a method of manufacturing the same.

The use of oscillation in the direction of thickness of a piezoelectric polymer film in an ultrasonic beam focusing device for ultrasonic diagnosis has recently been studied. In such studies, the thickness of a piezoelectric polymer film is determined by the frequency of a transmitted or received ultrasound or ultrasonic beam and the mode of oscillation of the film. However, in general, since the frequency of ultrasonic beams for ultrasonic diagnosis is from several MHz to several tens of MHz, the thickness of the piezoelectric polymer film may be within the range of about 30 to several hundred micrometers. However, when a piezoelectric polymer film has a thickness falling within this range, the film as a piezoelectric oscillator cannot retain its shape. In view of this problem, a λ/2 wavelength mode ultrasonic transducer has been proposed which has a piezoelectric polymer film adhered to some type of a support, as shown in FIG. 1. More specifically, electrodes 2a and 2b are formed on the two major surfaces of a piezoelectric polymer film 1. The electrode 2a is adhered to a support 3 through an adhesive or the like, while the electrode 2b is adhered to a matching layer or an electrically insulating layer 4. A pair of lead wires 5 are respectively connected to the electrodes 2a and 2b. The matching layer 4 effectively propagates an ultrasonic beam received or emitted by the piezoelectric polymer film 1. The matching layer 4 also electrically insulates the electrode 2b from an object to be examined. The support 3 must stably hold the piezoelectric polymer film 1 and must not reflect the ultrasonic beam received by the piezoelectric polymer film 1 in any direction other than toward the object. The support 3 must also have wide-band characteristics, a good response and a small conversion loss.

In view of this situation, Japanese Patent Laid-Open Publication No. 55-163999 (piezoelectric polymer transducers) proposes a λ/4 wavelength mode ultrasonic transducer with a foamed sheet which has an acoustic impedance smaller than that of a piezoelectric polymer film and which has more small pores. The foamed sheet, in this context, means a sheet of foamed styrol, foamed polyethylene or foamed polyurethane; or a sheet comprising a film of a polymer, a metal, ceramics, glass or the like which has a number of small pores or concavities formed by chemical etching, machining or electric-discharge machining. However, since such a foamed sheet is included as an additional layer to the piezoelectric polymer film, it must be adhered to a support of an acrylic or epoxy resin with an adhesive. This presents the difficulty of controlling the film thickness of the additional layer and of loss of the ultrasonic beam through the assembly of the additional layer and the support.

Meanwhile, in the field of ultrasonic beam focusing devices, it is known to concave a piezoelectric polymer film so as to focus the ultrasound beam emitted from the film at a single point in an acoustic propagation medium or in an object to be examined, in order to generate an intense ultrasound field and thus to improve resolution of the focusing device. This technique is disclosed in Japanese Patent Laid-Open Publication No. 53-25389 entitled "Ultrasound beam focusing device". In this prior art technique, a piezoelectric polymer film is adhered to a concaved electrode or an electrode supported on a concaved support. Alternatively, electrodes are adhered to two major surfaces of a piezoelectric polymer film and the overall assembly is pressed and made concave. However, with this method, the precision in the radius of curvature of the concave portion may be low. Additionally, the electrodes may not be sufficiently adhered to the piezoelectric polymer film, thus resulting in separation of the film.

SUMMARY OF THE INVENTION

It is an object of the present invention to provide a λ/2 wave length mode ultrasonic beam focusing device which has a concave surface and which can effectively emit and receive an ultrasonic beam and generate an intense ultrasonic field by focusing the beam at a point in an acoustic propagation medium or in an object to be examined.

It is another object of the present invention to provide a method of manufacturing an ultrasonic beam focusing device with a concave surface.

These and other objects have been attained by the λ/2 wavelength mode ultrasonic beam focusing device with a concave surface which comprises:

a cylindrical housing having a step inside a distal end thereof;

a circular piezoelectric polymer film which is formed contiguously with the step, which is curved in a concave form relative to an acoustically active surface thereof, and which has a pair of circular electrodes at two respective surfaces thereof, the piezoelectric polymer film generating, in response to a signal applied to the electrodes, an ultrasonic beam, which is focused at a single point, and transducing a received ultrasonic beam into an electric signal;

leads respectively connected to the electrodes;

a rigid polyurethane supporting substrate which is formed to be in tight contact with the electrode inside the housing which is at the side of an acoustically inactive surface of the piezoelectric polymer film, the rigid polyurethane layer absorbing an ultrasound beam at the side of the acoustically inactive surface and supporting the piezoelectric polymer film; and an insulating layer which is formed to be in contact with the electrode inside the housing which is at the side of the acoustically active surface of the piezoelectric polymer film for electrically insulating the electrode.

The ultrasonic beam focusing device described above is free of loss of the ultrasound beam due to the adhesive between the support and a sheet (additional layer) connected to the electrode. The device is capable of effectively emitting and receiving an ultrasonic beam and of generating an intense ultrasonic field by focusing an ultrasound beam at a single point in an acoustic propagation medium or in an object to be examined.

The device of the present invention can also firmly hold a piezoelectric polymer film.

A method of manufacturing an ultrasonic beam focusing device with a concave surface according to the present invention, comprises the steps of:

forming two electrodes on two respective surfaces of a circular piezoelectric polymer film;

connecting leads to the electrodes, respectively;

arranging the piezoelectric polymer film inside a housing having a step inside a distal end thereof;

forming a rigid foamed polyurethane layer by injecting into the housing and foaming therein a rigid foamable polyurethane resin at the side of an acoustically inactive surface of the piezoelectric polymer film, shrinkage of the foamable polyurethane resin during formation of the rigid foamed polyurethane layer acting to curve the piezoelectric polymer film and to integrally form the rigid foamed polyurethane layer with the electrode on the acoustically inactive surface of the piezoelectric polymer film; and forming an insulating layer on the electrode at the side of an acoustically active surface of the piezoelectric polymer film.

With the method of the present invention as described above, an ultrasonic beam focusing device may be easily manufactured, and ultrasound beam loss due to the adhesive between the support and the sheet connected to the electrode can be prevented.

BRIEF DESCRIPTION OF THE DRAWINGS

Other objects and advantages will be apparent from the following description taken in conjunction with the accompanying drawings in which.

DETAILED DESCRIPTION OF THE PREFERRED EMBODIMENTS

Figure 1:
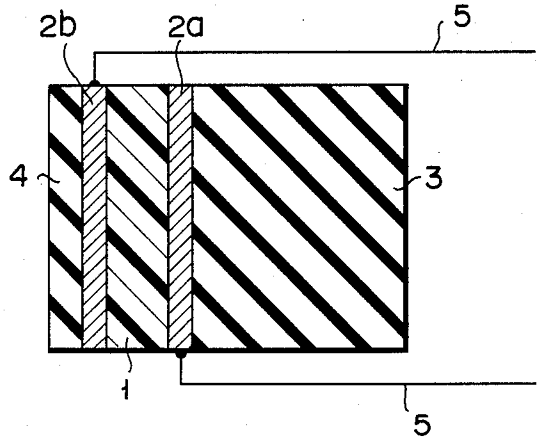
FIG. 1 (PRIOR ART)
FIG. 1 is a sectional view of a conventional ultrasonic beam focusing device.

In general, in order to obtain an ultrasonic beam focusing device which can effectively emit an ultrasonic beam into an acoustic propagation medium or an object to be examined by oscillation in the direction of thickness of a piezoelectric polymer film and which can effectively receive an ultrasonic wave (echo wave) reflected therefrom by the piezoelectric polymer film, a rear load layer which has an acoustic impedance smaller than that of the piezoelectric polymer film is formed on the surface of the piezoelectric polymer film opposing the acoustically active surface thereof. A rear load layer which satisfies such conditions may be a sheet or a block of a polymer containing a number of small pores, such as foamed styrol, foamed polyethylene, or foamed polyurethane. However, even if such a rear load layer is formed on the surface of a piezoelectric polymer film at the side of the acoustically inactive surface, a satisfactory ultrasonic beam focusing device may not be obtained. The rear load layer must be adhered to a support of an acrylic or epoxy resin support.

In view of this problem, the present inventors searched for a material which would satisfy the conditions for both the rear load layer and the support of the piezoelectric polymer film. Such a material must be rigid and have a number of small pores and a small acoustic impedance. The extensive studies made have revealed that a rigid foamed polyurethane satisfies these conditions.

As described above, when a support with a number of small pores is adhered to a piezoelectric polymer film by an adhesive, ultrasonic beam loss occurs in the adhesive. Furthermore, adhesion reliability is also low. In order to solve this problem, the present inventors brought a piezoelectric polymer film into direct contact with a support so as to acoustically form them integral. More specifically, according to the method of the present invention, a stock solution of a foamable polyurethane resin is injected into a housing having a piezoelectric polymer film at its distal end and is foamed therein so as to form a piezoelectric polymer film and a support integral with each other.

Furthermore, when the stock solution of the foamable polyurethane resin is foamed, the resultant piezoelectric polymer film is attracted toward the rigid foamed polyurethane layer. As a result of this, when foaming is completed, the piezoelectric polymer film is curved, coming into firm contact with the rigid foamed polyurethane layer. Thus, the piezoelectric polymer film is firmly adhered to the rigid foamed polyurethane layer through the electrode. The present inventors have also found that the radius of curvature of the piezoelectric polymer film may be freely selected by changing the volume of the housing (the length of the housing if the inner diameter is to remain constant) while maintaining the composition and reaction conditions of the foamable polyurethane resin stock solution constant.

The present invention will now be described in detail with reference to FIGS. 2A to 2E.

Figure 2A:
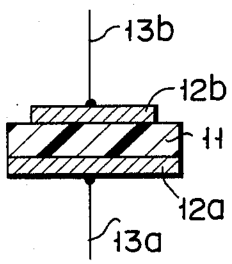
FIGS. 2A to 2E are sectional views for showing steps of a method of manufacturing a ultrasonic beam focusing device according to the present invention.
Figure 2B:
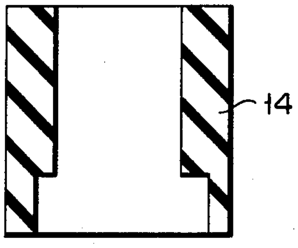
Figure 2C:
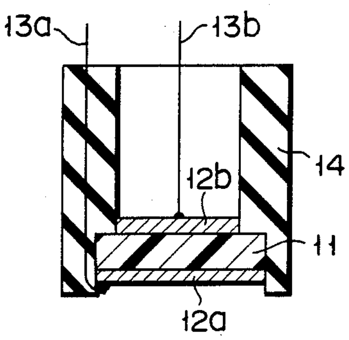

Referring to FIG. 2A, a film 65 μm thick which is to become a piezoelectric polymer film is prepared by uniaxially stretching a polyvinylidene fluoride film or a film of a copolymer of polyvinylidene fluoride with trifluoroethylene. Silver is then deposited by sputtering or vacuum evaporation on both surfaces of the resultant film to a thickness of about 0.5 μm. A DC voltage of 5,000 V is applied to the Ag films thus obtained at 100° C. for an hour so as to form a piezoelectric polymer film 11. One of the Ag films is used as a first electrode 12*a* having a diameter of 16 mm. The other Ag film is etched to form a second electrode 12*b* having a diameter of 13 mm. The electrodes 12*a* and 12*b* may alternatively be formed by a coating of a conductive paint or the like. The centers of the first and second electrodes 12*a* and 12*b* are aligned. A lead 13*b* is connected to the center of the second electrode 12*b* by a conductive epoxy resin adhesive ("Dotight D-573"; a product of Fujikura Kasei K.K.). Similarly, a lead 13*a* is connected to the end face of the first electrode 12*a* by the same adhesive. Thereafter, as shown in FIG. 2B, a cylindrical housing 14 having a step inside a distal end thereof for receiving the piezoelectric polymer film 11 therein is prepared. Then, as shown in FIG. 2C, the piezoelectric polymer film 11 is adhered with a similar adhesive to the step of the cylindrical housing 14 such that the first electrode 12*b* faces inward. The housing 14 has an inner diameter of 13 mmφ (16 mmφ at the distal end), an outer diameter of 25 mmφ, and a length of 25 mm. The wall of the housing 14 has a small hole (not shown) through which the lead 13*a* from the first electrode 12*a* extends.

Figure 2D:
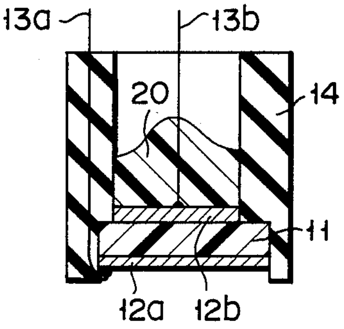

Then, as shown in FIG. 2D, a stock solution of a foamable polyurethane resin 20 having the composition as shown in Table 1 below is quickly injected into the housing 14 to be in contact with the second electrode 12*b*. The polyurethane resin solution is foamed at ambient temperature.

TABLE 1

| Constituents | Amount (parts by weight) |
|---|---|
| Polyol (sugar-based) | 100 |
| Isocyanate (35% NCO content) | 120 |
| Foam stabilizer (silicone-type) | 2 |
| Freon (R11) | 40 |
| Catalyst (amine-type) | 1 |
| Hydrogen oxide | 2 |

Figure 2E:
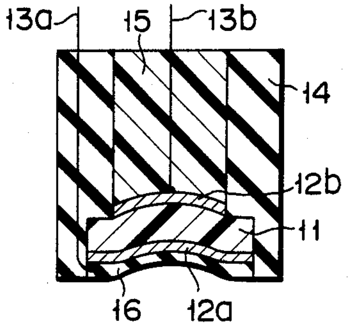

Then, as shown in FIG. 2E, the stock solution of the foamable polyurethane resin 20 is transformed into a rigid polyurethane layer 15 having a number of small pores. The layers 15 uniformly fills the housing 14. Simultaneously, the piezoelectric polymer film 11 and the first and second electrodes 12*a* and 12*b* are concaved to substantially the same degree to bulge toward the rigid polyurethane layer 15. The second electrode 12*b* becomes integrally formed with the rigid polyurethane layer 15. Subsequently, a silicone resin is coated to a thickness of about 10 μm on the electrode 12*a* at the distal end of the housing 14, thus forming an insulating layer 16 consisting of the silicone resin. The average pore diameter, density, and sonic velocity in the rigid polyurethane layer of a concaved ultrasonic beam focusing device prepared in this manner were measured to be 0.293 mm, 0.255 g/cm$^3$ and 720 m/sec, respectively. The acoustic impedance of the rigid polyurethane layer was thus calculated to be $1.84\times10^4$ kg/m$^2$sec.

A concaved ultrasonic beam focusing device manufactured in this manner has the following structure. A circular piezoelectric polymer film 11 having circular first and second electrodes 12*a* and 12*b* on its two surfaces is concaved relative to its acoustically active surface in a cylindrical housing 14 and is fixed to the step of the housing 14. Leads 13*a* and 13*b* are respectively connected to the electrodes 12*a* and 12*b*. A rigid polyurethane layer 15 is formed inside the housing 14 at the side of the acoustically inactive surface so as to be formed integrally with the second electrode 12*b*. An insulating layer 16 is formed inside the housing 14 at the side of the acoustically active surface.

According to the present invention, the rigid polyurethane layer 15 has an acoustic impedance ($1.84\times10^4$ kg/m$^2$sec) which is smaller than that ($4.02\times10^6$ kg/m$^2$sec) of the piezoelectric polymer film 11. For this reason, a concaved ultrasonic beam focusing device may be obtained which has a good sensitivity and ringing characteristic of an ultrasonic wave (echo wave) reflected from an object to be examined. In order to demonstrate this, the sensitivity and ringing of the ultrasonic beam focusing device (Example) of the present invention (FIG. 2E) and of an ultrasonic beam focusing device (Comparative Example) obtained by filling the structure of FIG. 2C with a rigid polyurethane resin were measured. Measurements were made connecting these devices to a UTA-3 (50 Ω input impedance) of KB-AEROTECH CORPORATION and driving them by 150 V strike pulses. The object examined was a methacrylic resin block submerged in water to a depth of 70 mm. The obtained results are shown in Table 2. In Table 2, the relative sensitivity of the ultrasonic beam focusing device of the Comparative Example is given as an indexed value when that of the Example is defined as 1. The ringing is an index of the resolution of the focusing device, and represents the number of waves generated before attenuation from a maximum sensitivity to −40 dB.

TABLE 2

| | Relative sensitivity | Number of waves |
|---|---|---|
| Comparative Example | 0.72 | 4.6 |
| Example | 1.0 | 3.5 |

It may be seen from Table 2 above that the ultrasonic beam focusing device of the Example has a higher sensitivity and a smaller ringing than the Comparative Example.

With the device of the present invention, the rigid polyurethane layer 15 is so filled in the housing 14 as to have a number of small pores and a sufficient hardness. For this reason, the piezoelectric polymer film need not be adhered to an acrylic or epoxy resin support by an adhesive, unlike the case of a conventional device. The device of the present invention may also be lighter than that of a conventional device.

Furthermore, according to the present invention, when the rigid polyurethane layer 15 is formed, the piezoelectric polyurethane film 11 can be shaped concave to have a high-precision radius of curvature. Since the piezoelectric polymer film 11 is tightly adhered to the first and second electrodes 12*a* and 12*b*, the conventional problem of ultrasound beam loss due to the use of an adhesive may be eliminated. Accordingly, an ultrasonic beam emitted or received by the piezoelectric polymer film 11 can be focused at a point within an acoustic propagation medium or an object to be examined so as to generate an intense ultrasound field. The device of the present invention thus has improved resolution.

Figure 3:
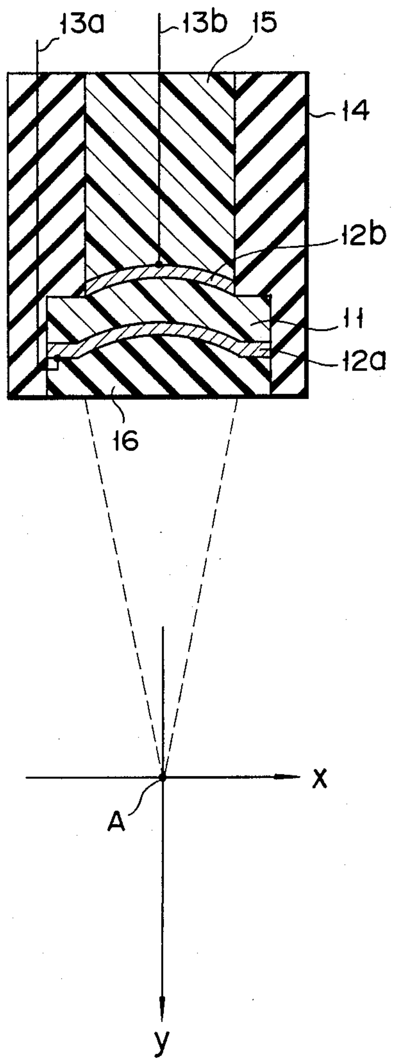
FIG. 3 is a schematic view showing an experiment for testing the characteristics of a ultrasonic beam focusing device according to the present invention.
Figure 4:
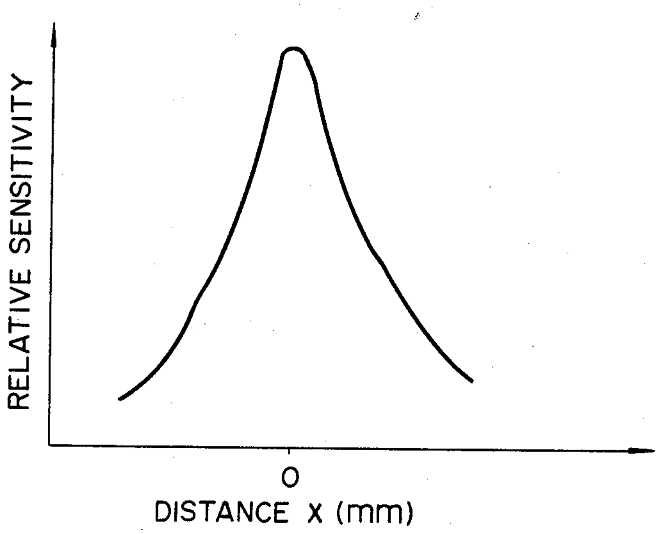
FIGS. 4 and 5 are graphs showing the results obtained in the experiment shown in FIG. 3.
Figure 5:
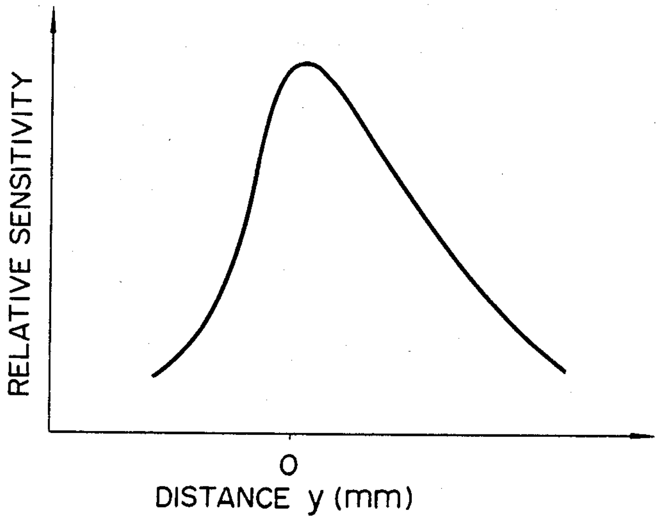

The effects obtainable with the device of the present invention will now be described in more detail with reference to FIGS. 3 to 5. Referring to FIG. 3, a nylon-based material having a diameter of 0.5 mm was placed as a target at a position A 70 mm apart along the central axis of the device. FIGS. 4 and 5 show the relative sensitivity of the echo wave when the target is moved in the directions x and y, respectively. When $x=0$ (the target is on the central axis of the device) and $y=75$ mm (the target is 75 mm apart from the surface of the piezoelectric polymer film 11), the relative sensitivity of the echo wave is maximum.

According to the present invention, a stock solution of a foamable polyurethane resin is easily foamed within the housing 14. Then, a rigid polyurethane layer 15 functioning as both the support and the rear load layer of the piezoelectric polymer film 11 can be formed. Accordingly, a concave structure may be obtained simultaneously with the foaming of a stock solution of a foamable polyurethane resin without requiring preforming of the piezoelectric polymer film 11 into a concave form. The manufacture of a device of the present invention is much easier than that of a conventional device.

In the embodiment described above, the stock solution of the foamable polyurethane resin having the composition shown in Table 1 is used. However, the present invention is not limited to this. Similar results may be obtained with foamable polyurethane resins having other compositions.

In summary, the present invention provides an ultrasonic beam focusing device and a method of manufacturing the same, in which the device can effectively emit and receive an ultrasonic beam to result in a good sensitivity and good ringing characteristics, and can focus the ultrasonic beam at a single point in an object to be examined or in an acoustic propagation medium so as to generate an intense ultrasonic field. In addition, the device of the present invention is light in weight and is easy to manufacture.

What is claimed is:

1. A λ/2 wavelength mode ultrasonic beam focusing device with a concave surface comprising:

a cylindrical housing having a step inside a distal end thereof;

a circular piezoelectric polymer film which is formed contiguously with said step, which is curved in a concave form raltive to an acoustically active surface thereof, and which has a pair of circular electrodes at two respective surfaces thereof, said piezoelectric polymer film generating, in response to a signal applied to said electrodes, an ultrasonic beam, which is focused at a single point, and transducing a received ultrasonic beam into an electric signal;

leads respectively connected to said electrodes;

a rigid polyurethane supporting substrate which is filled in said housing so as to directly contact said electrode which is at the side of an acoustically inactive surface of said piezoelectric polymer film, said rigid polyurethane layer absorbing an ultrasound beam at the side of the acoustically inactive surface and supporting said piezoelectric polymer film; and an insulating layer which is formed to be in contact with said electrode inside said housing which is at the side of said acoustically active surface of said piezoelectric polymer film for electrically insulating said electrode.

2. An ultrasonic beam focusing device according to claim 1, wherein said rigid polyurethane layer is made of foamed polyurethane.

3. An ultrasonic beam focusing device according to claim 2, wherein said piezoelectric polymer film has an acoustic impedance greater than that of said foamed polyurethane layer.

4. An ultrasonic beam focusing device according to claim 3, wherein said piezoelectric polymer film comprises one of polyvinylidene fluoride and a copolymer thereof with trifluoroethylene.

5. An ultrasonic beam focusing device according to claim 4, wherein said electrodes are formed by sputtering or vacuum evaporation.

6. An ultrasonic beam focusing device according to claim 5, wherein said leads are connected to said electrodes by a conductive epoxy resin adhesive.

7. An ultrasonic beam focusing device according to claim 4, wherein said electrodes are formed by coating a conductive paint.

8. An ultrasonic beam focusing device according to claim 7, wherein said leads are connected to said electrodes by a conductive epoxy resin adhesive.

* * * * *